(12) United States Patent
Watanabe et al.

(10) Patent No.: US 8,259,523 B2
(45) Date of Patent: Sep. 4, 2012

(54) SEMICONDUCTOR MEMORY DEVICE

(75) Inventors: Toshifumi Watanabe, Yokohama (JP); Tomoyuki Hamano, Yokohama (JP); Shigefumi Ishiguro, Chigasaki (JP); Kazuto Uehara, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 204 days.

(21) Appl. No.: 12/836,944

(22) Filed: Jul. 15, 2010

(65) Prior Publication Data

US 2011/0013452 A1 Jan. 20, 2011

(30) Foreign Application Priority Data

Jul. 17, 2009 (JP) ................................ 2009-169255

(51) Int. Cl.
*G11C 7/00* (2006.01)

(52) U.S. Cl. ...................... 365/203; 365/189.2; 365/202

(58) Field of Classification Search .................... 365/203
See application file for complete search history.

(56) References Cited

U.S. PATENT DOCUMENTS

| | | | | |
|---|---|---|---|---|
| 5,875,133 | A * | 2/1999 | Miyashita et al. | ....... 365/189.09 |
| 6,813,211 | B2 * | 11/2004 | Takatsuka et al. | ............ 365/222 |
| 6,891,775 | B2 * | 5/2005 | Takeuchi | .................... 365/233.5 |
| 2009/0316494 | A1 | 12/2009 | Uehara et al. | |

FOREIGN PATENT DOCUMENTS

| | | |
|---|---|---|
| JP | 2005-196949 | 7/2005 |
| JP | 2006-286179 | 10/2006 |
| JP | 2009-152658 | 7/2009 |

OTHER PUBLICATIONS

U.S. Appl. No. 12/836,851, filed Jul. 15, 2010, Hamano et al.

* cited by examiner

*Primary Examiner* — Son Mai

(74) *Attorney, Agent, or Firm* — Oblon, Spivak, McClelland, Maier & Neustadt, L.L.P.

(57) ABSTRACT

According to one embodiment, a semiconductor memory device includes a first memory, a second memory and a control circuit. The first memory includes a first bank number. The second memory includes a second bank number larger than the first bank number. The control circuit controls a precharge operation with respect to bit lines provided in the first and second memories. When performing, with respect to the first memory, a synchronous operation that is effected in synchronization with a clock, the control circuit changes over a second precharge operation to an operation time different from a first precharge operation during a period from the end of the initial first precharge operation to the start of the subsequent second precharge operation after receiving an address.

15 Claims, 6 Drawing Sheets

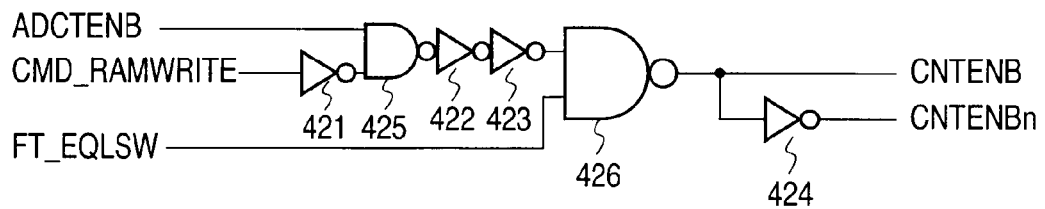
F I G. 4
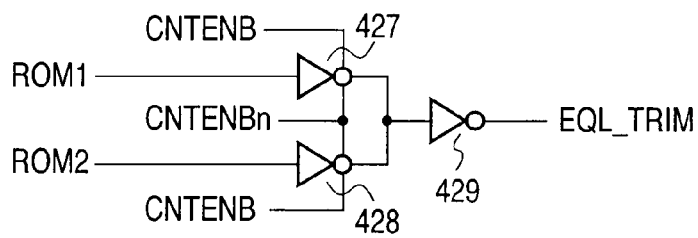
F I G. 5
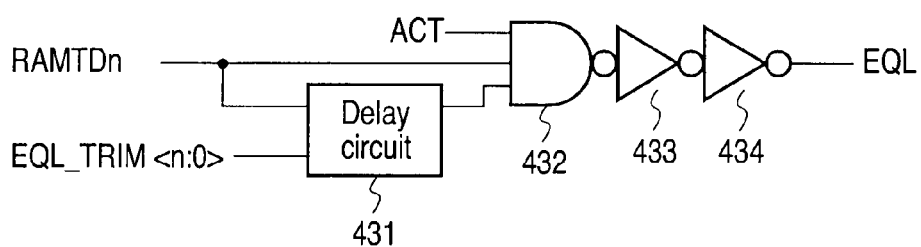
F I G. 6
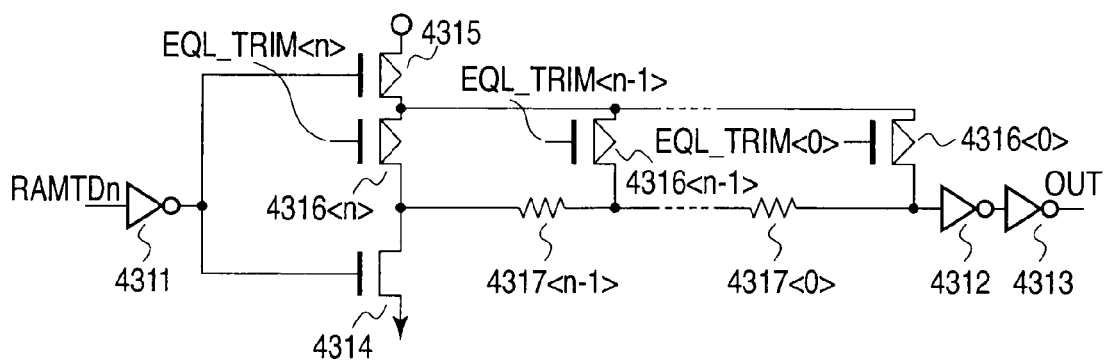
F I G. 7

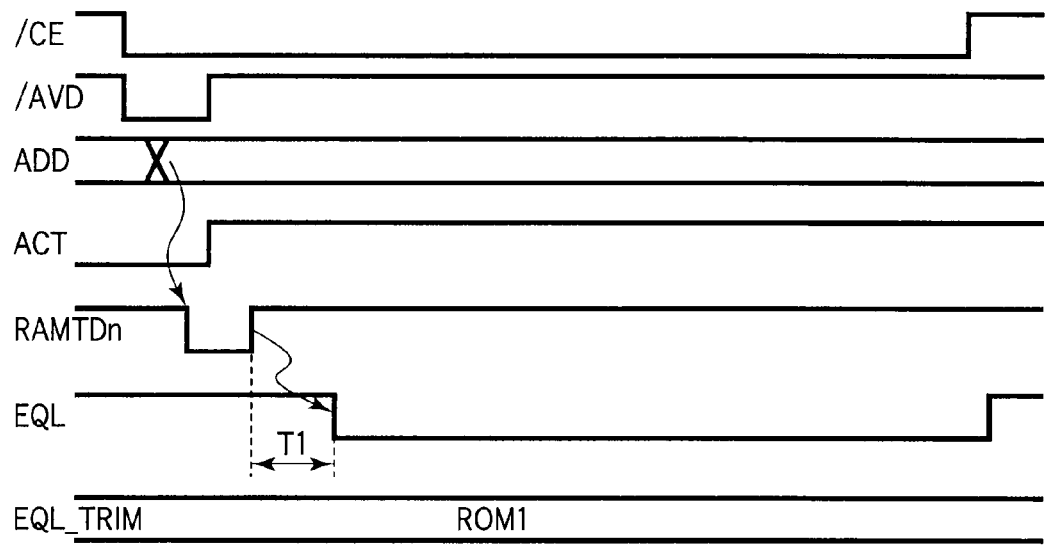
F I G. 8
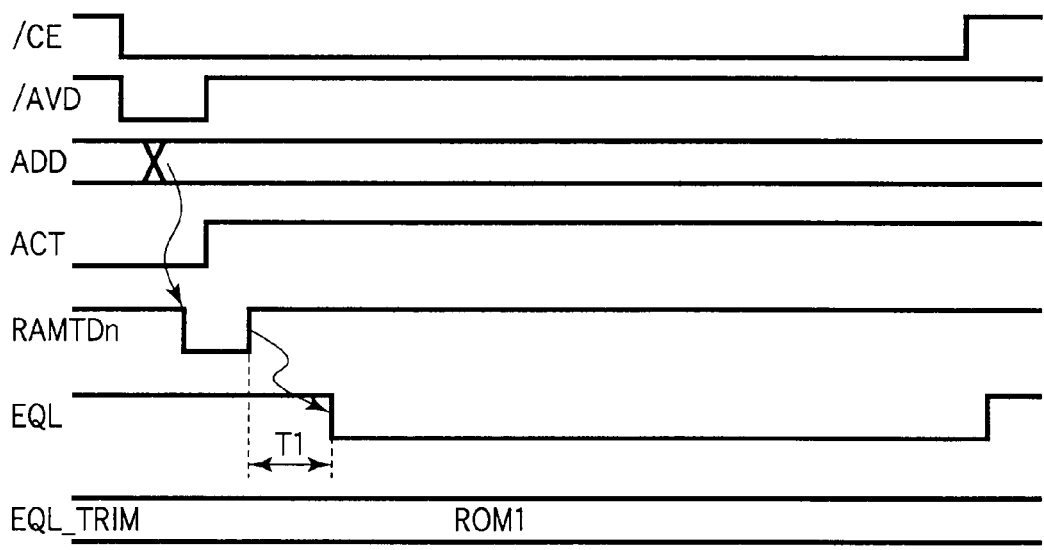
F I G. 9

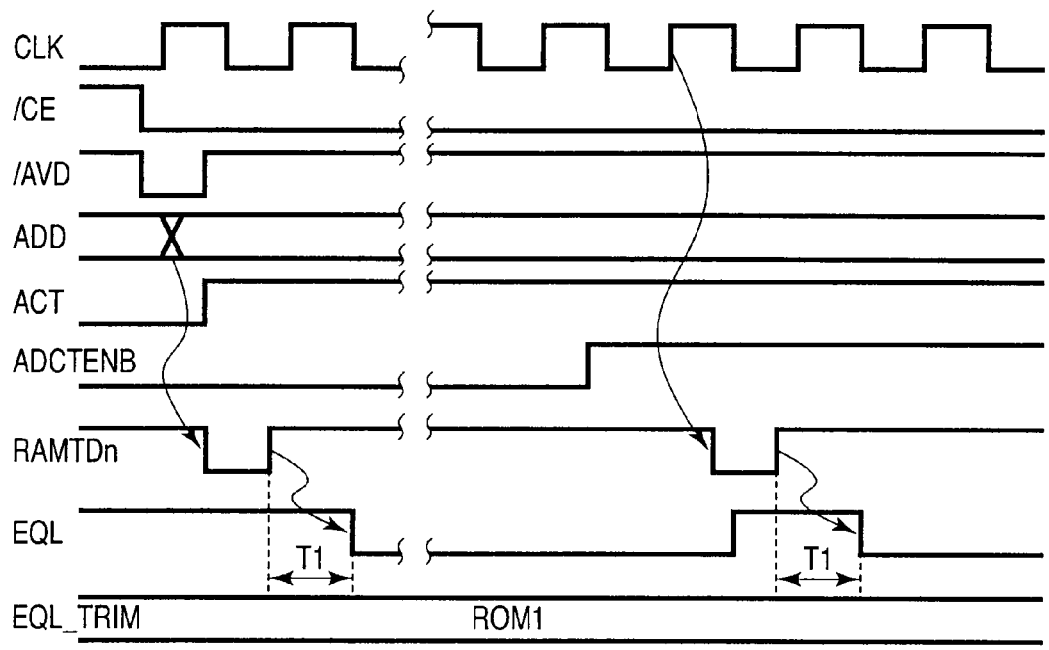
F I G. 10
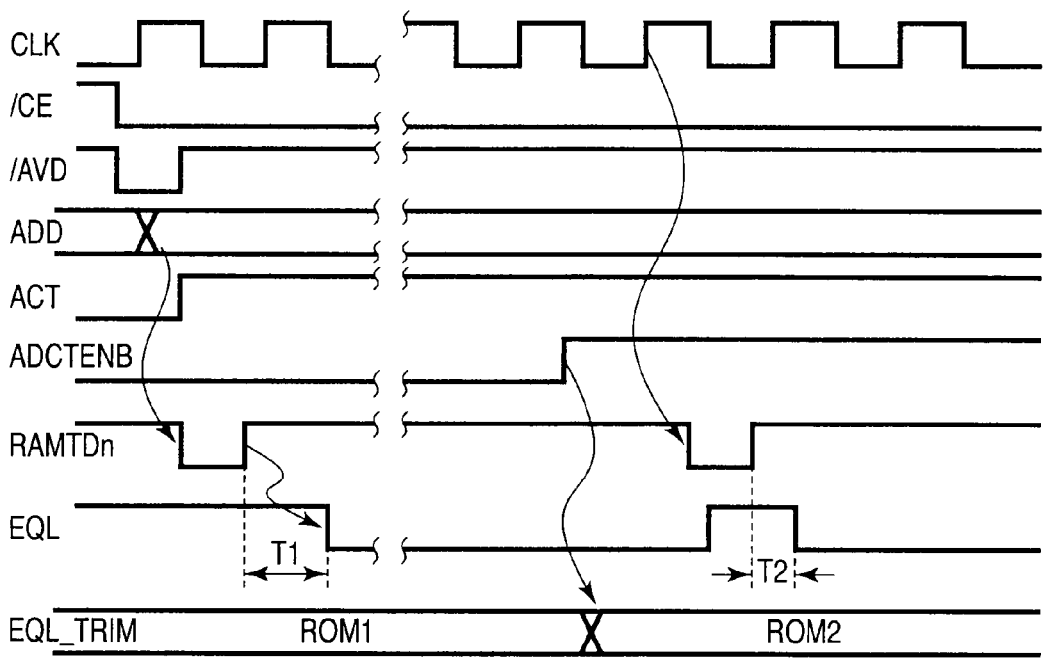
F I G. 11

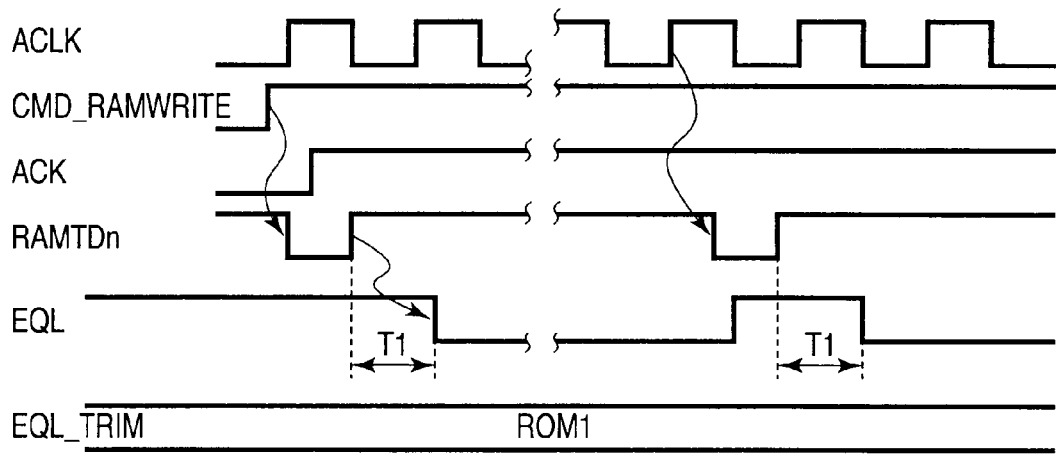
F I G. 12
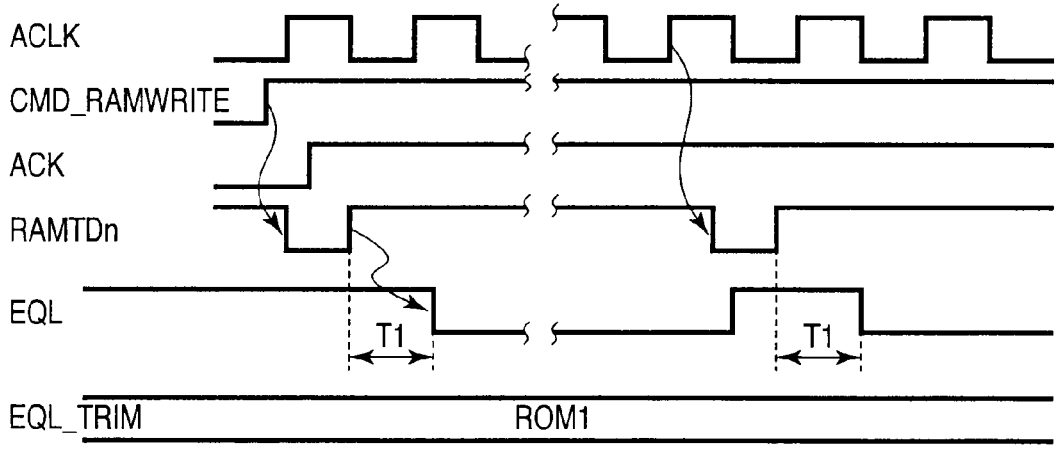
F I G. 13
| | Async Read | Async Write | Sync Read | Sync Write | Load | Program |
|---|---|---|---|---|---|---|
| BootRAM | ROM1 | (ROM1) | ROM2 | (ROM2) | ROM1 | ROM1 |
| DataRAM0/1 | ROM1 | ROM1 | ROM1 | ROM1 | ROM1 | ROM1 |
F I G. 14

SEMICONDUCTOR MEMORY DEVICE

CROSS-REFERENCE TO RELATED APPLICATIONS

This application is based upon and claims the benefit of priority from Japanese Patent Application No. 2009-169255, filed Jul. 17, 2009; the entire contents of which are incorporated herein by reference.

FIELD

Embodiments described herein relate generally to a semiconductor memory device having a plurality of types of memories integrated in one chip, and relates to, e.g., a semiconductor memory device having an asynchronous operation and a synchronous operation.

BACKGROUND

As an example of a semiconductor memory device having a plurality of types of memories integrated in one chip, there is a OneNAND (a registered trademark) (see, e.g., JP-A 2006-286179 (KOKAI)). In this OneNAND, a NAND flash memory as a main memory unit, an SRAM as a buffer unit and others are integrated in one chip. Further, in the OneNAND, a controller having a state machine mounted thereon is prepared to control data transfer between, e.g., a NAND flash memory and an SRAM.

Here, in the OneNAND, the SRAM can be formed of a plurality of buffer memories having different bank structures.

However, when controlling operations in the plurality of buffer memories by using the same timer, a synchronous operation is also set in accordance with an asynchronous operation in conventional examples. In this case, to cope with skew of an external input signal input from the outside at the time of the asynchronous operation, a longer operation period is set. Therefore, in the synchronous operation, the operation period that is long beyond necessity is set.

That is, when a plurality of memory devices having different configurations are present in one chip, a control timer must be coordinated with the slowest memory device in each operation to guarantee data. Therefore, there is a problem that the coordination with the slowest memory device must be carried out even in the synchronous operation and hence a speed of the operation cannot be increased.

BRIEF DESCRIPTION OF THE DRAWINGS

FIG. 4 is a circuit diagram showing a configuration of the equalizing timer control circuit in the embodiment;

FIG. 5 is a circuit diagram showing a configuration of the equalizing timer control circuit in the embodiment;

FIG. 6 is a circuit diagram showing a configuration of the equalizing timer in the embodiment;

FIG. 7 is a circuit diagram showing a configuration of a delay circuit in the equalizing timer in the embodiment;

FIG. 8 is a timing chart showing a read operation at the time of an external asynchronous operation in a DataRAM according to the embodiment;

FIG. 9 is a timing chart showing a read operation at the time of an external asynchronous operation in a BootRAM according to the embodiment;

FIG. 10 is a timing chart showing a read operation at the time of an external synchronous operation in the DataRAM according to the embodiment;

FIG. 11 is a timing chart showing a read operation at the time of an external synchronous operation in the BootRAM according to the embodiment;

FIG. 12 is a timing chart showing a read operation at the time of an internal synchronous operation in the DataRAM according to the embodiment;

FIG. 13 is a timing chart showing a read operation at the time of an internal synchronous operation in the BootRAM according to the embodiment; and FIG. 14 is a view showing which one of signals ROM1 and 2 is selected in each operation of the SRAM according to the embodiment.

DETAILED DESCRIPTION

Figure 1:
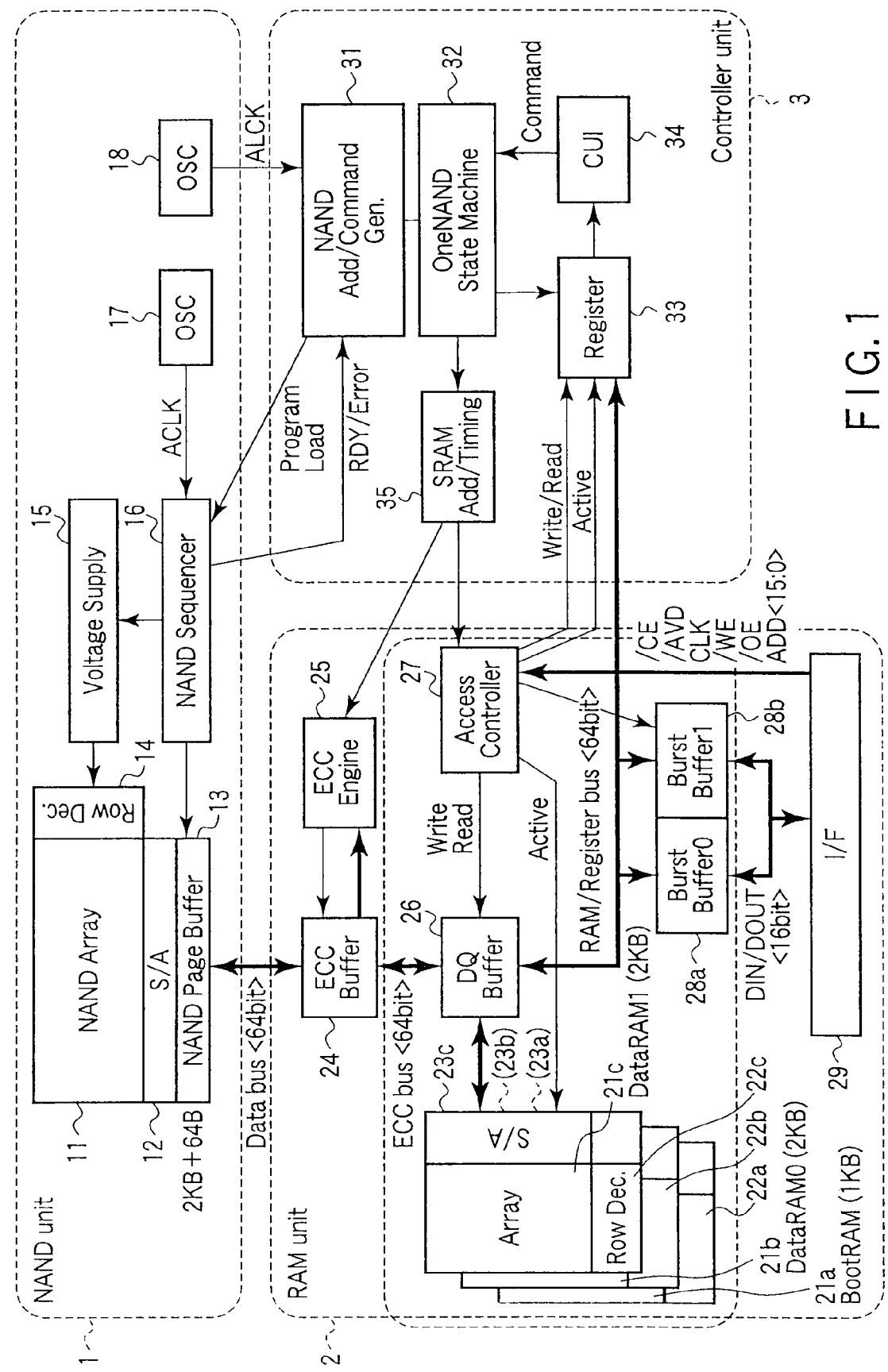
FIG. 1 is a block diagram showing a configuration of a semiconductor memory device according to an embodiment.

A semiconductor memory device according to an embodiment will now be described hereinafter with reference to the accompanying drawings. Here, a OneNAND will be taken as an example of the semiconductor memory device. For the description, like reference numerals denote like parts throughout the drawings.

In general, according to one embodiment, a semiconductor memory device includes a first memory, a second memory and a control circuit. The first memory includes a first bank number. The second memory includes a second bank number larger than the first bank number. The control circuit controls a precharge operation with respect to bit lines provided in the first and second memories. When performing, with respect to the first memory, a synchronous operation that is effected in synchronization with a clock, the control circuit changes over a second precharge operation to an operation time different from a first precharge operation during a period from the end of the initial first precharge operation to the start of the subsequent second precharge operation after receiving an address.

[1] Configuration of Semiconductor Memory Device According to Embodiment

FIG. 1 is a block showing a configuration of a semiconductor memory device according to the embodiment.

As shown in the drawing, in this semiconductor memory device, a NAND flash memory 1 as a main memory unit (a NAND unit), an SRAM 2 as a buffer unit (an RAM unit) and a controller 3 as a control unit (a controller unit) that controls the NAND flash memory 1 and the SRAM 2 are integrated in one chip.

[1-1] Configuration of NAND Flash Memory 1

The NAND flash memory 1 includes a memory cell array (a NAND Array) 11, a sense amplifier (S/A) 12, a page buffer (a NAND Page Buffer) 13, a row decoder (a Row Dec.) 14, a voltage supply circuit (a Voltage Supply) 15, a sequencer (a NAND Sequencer) 16 and oscillators (OSCs) 17 and 18.

The memory cell array 11 is a cell array of the NAND flash memory 1, and it includes a plurality of memory cells (not shown) arranged in a matrix form at crossing positions of bit lines and word lines. Each of the plurality of memory cells is formed of an MOS type transistor having a laminated gate structure including, e.g., a floating gate electrode, an intergate insulating film and a control gate electrode sequentially laminated on a semiconductor substrate through a tunnel insulating film.

Furthermore, each of the plurality of memory cells can hold data consisting of 1 bit in accordance with a change in threshold voltage caused based on the number of electrons implanted in the floating gate electrode. It is to be noted that the control over the threshold voltage may be segmented to hold data of 2 bits or more in each of the memory cells. Moreover, the memory cell may have an MONOS (Metal Oxide Nitride Oxide Silicon) structure adopting a system that traps electrons in a nitride film.

The sense amplifier 12 reads out memory cell data corresponding to one page in the memory cell array 11. Here, the page means a unit that data is collectively written or read out in the NAND flash memory 1. For example, a plurality of memory cells connected to the same word line constitute 1 page.

The page buffer 13 temporarily stores read data or write data corresponding to 1 page under control of the sequencer 16, and it has a storage capacity of, e.g., 2 KB+64 B.

The row decoder 14 is a decoder that selects each word line in the memory cell array 11.

The voltage supply circuit 15 generates a voltage (an Internal Voltage) required for reading, writing and erasing in the memory cell array 11 and supplies the generated voltage to the row decoder 14 under control of the sequencer 16.

The sequencer 16 executes control, e.g., writing (Program), reading (Load) or erasing with respect to the NAND flash memory 1 in response to a command (Program/Load) for the NAND flash memory 1 issued in an address/command generation circuit (a NAND Add/Command Gen.) 31.

The oscillator 17 generates an internal clock ACLK for an internal control circuit of the sequencer 16. The oscillator 18 generates an internal clock ACLK for an internal control circuit of the state machine (an OneNAND State Machine) 32.

[1-2] Configuration of SRAM 2

The SRAM 2 includes a plurality of (three in this example) SRAM cell arrays (Arrays) 21a to 21c, a plurality of row decoders (Row Dec.) 22a to 22c, a plurality of sense amplifiers (S/A) 23a to 23c, an ECC buffer 24, an ECC engine 25, a DQ buffer 26, an access controller 27, burst buffers (Burst Read/Write buffers) 28a and 28b and a user interface (I/F) 29.

Each of the SRAM cell arrays 21a to 21c stores write data that is programmed into the NAND flash memory 1 or read data loaded from the NAND flash memory 1. These SRAM cell arrays 21a to 21c are utilized as buffer memories that communicate with a non-illustrated external host device. Each of the SRAM cell arrays 21a to 21c includes a plurality of memory cells (SRAM cells) arranged in a matrix shape at crossing positions of word lines and a pair of bit lines.

Each of the row decoders 22a to 22c is a decoder that selects a word line of each of the SRAM cell arrays 21a to 21c.

Each of the sense amplifiers 23a to 23c reads out SRAM cell data. Moreover, each of the sense amplifiers 23a to 23c also functions as a load for writing.

In this embodiment, for example, the SRAM cell array 21a is a buffer memory that functions as a BootRAM formed of 1 bank (1 KB) that is a bank 0. The SRAM cell array 21b is a buffer memory that functions as a DataRAM0 formed of 2 banks (2 KB), i.e., banks 0 and 1, and the SRAM cell array 21c is a buffer memory that functions as a DataRAM1 formed of 2 banks, i.e., banks 0 and 1. It is to be noted that the number of DataRAMs is not restricted to 2 (DataRAMs0 and 1), and more DataRAMs can be provided.

The ECC buffer 24 is placed between the SRAM 2 and the page buffer 13, and it temporarily stores data for ECC processing (error correction when loading data/parity generation when programming data).

The ECC engine 25 corrects an error of data (Data) input to the ECC buffer 24 and outputs the corrected data (Correct) to the ECC buffer 24.

The DQ buffer 26 temporarily stores data to read out data (Read) from the SRAM cell arrays 21a to 21c and write data (Write) into the SRAM cell arrays 21a to 21c.

The access controller 27 executes control required for each internal circuit in response to an address (ADD<15:0>) input from the user interface 29, a control signal (/CE, /AVD, CLK, /WE or /OE) and others.

For example, this access controller 27 includes a control circuit that executes a clock synchronous burst read function that operates in synchronization with a clock. This control circuit controls the burst buffers (Burst buffer0) 28a and (Burst buffer1) 28b at the time of clock synchronous burst read.

Each of the burst buffers 28a and 28b is a buffer that temporarily stores data to read data or write data.

The user interface 29 supports the same interface standard as that for an NOR type flash memory and performs, e.g., the input of addresses and control signals from the external host device and data input/output with respect to the external host device.

[1-3] Configuration of Controller 3

The controller 3 includes an address/command generation circuit 31, a state machine 32, a register 33, a CUI (Command User Interface) 34 and an address/timing generation circuit (SRAM Add/Timing) 35.

The address/command generation circuit 31 generates control signals for, e.g., an address and a command with respect to a NAND core (a NAND unit) as required at the time of an internal sequence operation.

The state machine 32 controls the internal sequence operation associated with a command type in response to issue of a command from the address/command generation circuit 31 or an internal command signal from the CUI 34.

The register 33 sets an operating state of a function and assigns a part of an external address space to read or write a control signal for, e.g., an address or a command by the external host device through the user interface 29.

The CUI 31 recognizes provision of a function executing command when a control signal for, e.g., an address or a command is written into a predetermined external address space of the register 33, thereby issuing an internal command signal.

The address/timing generation circuit 35 generates a control signal for, e.g., an address or a timing required to control the SRAM 2 as required at the time of an internal sequence operation.

In this embodiment, the page buffer 13 is connected with the ECC buffer 24 through a 64-bit NAND data bus. Additionally, the ECC buffer 24 is connected with the DQ buffer 26 through a 64-bit ECC data bus. The DQ buffer 26 is connected with each of the sense amplifiers 23a to 23c through a 64-bit SRAM data bus. The DQ buffer 26 is connected with the burst buffers 28a and 28b and the register 33 through a 64-bit (4×16 I/O) RAM/Register data bus. Further, each of the burst buffers 28a and 28b is connected with the user interface 29 through a 16-bit Data Input/Output (DIN/DOUT) bus.

[1-4] Configurations of Equalizing Timer Control Circuit and Equalizing Timer

The access controller 27 in the SRAM 2 receives an address (ADD<15:0>) input from the user interface 29 and a control signal (CLK, /CE, /AVD, /WE or /OE) and then executes control required for the SRAM cell arrays (the BootRAM and the DataRAM0 and 1) 21a to 21c. An address ADD includes a row address required to select a word line and a column address required to select a bit line.

The access controller 27 includes an equalizing timer control circuit and an equalizing timer. The equalizing timer control circuit and the equalizing timer control a precharge operation for precharging and equalizing a bit line connected with a memory cell when the selection of a word line connected to the memory cell in each of the SRAM cell arrays 21a to 21c is changed over.

Figure 2:
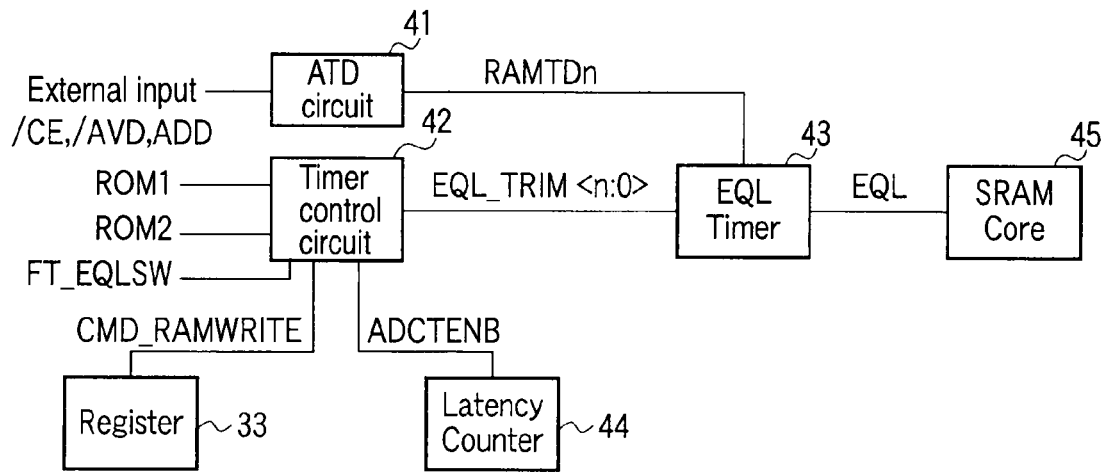
FIG. 2 is a block diagram showing configurations of an equalizing timer control circuit, an equalizing timer and their peripheral circuits in the semiconductor memory device according to the embodiment.

FIG. 2 is a block diagram showing configurations of the equalizing timer control circuit, the equalizing timer and their peripheral circuits in the access controller 27.

An address transition detection circuit (an ATD circuit) 41, an equalizing timer control circuit 42, an equalizing timer 43 and a latency counter 44 are included in the access controller 27, a register 33 is a register of the control unit 3, and an SRAM core 45 is included in the SRAM 2.

As external inputs, a chip enable signal /CE, an address valid signal /AVD and the address ADD are input to the ATD circuit 41. Then, the ATD circuit 41 detects changeover of the address ADD and outputs an address transition detection signal RAMTDn to the equalizing timer 43.

To the equalizing timer control circuit 42 are input a signal FT_EQLSW, a signal CMD_RAMWRITE, a signal ADCTENB, a signal ROM1 and a signal ROM2.

The signal FT_EQLSW is a signal that specifies whether a precharge operation time during which a bit line is precharged and equalized can be changed over. The signal CMD_RAM-WRITE is a signal that is output from the register 33 in the controller unit 3, and it specifies an internal operation performed between the NAND flash memory 1 and the SRAM 2.

The address counter enable signal ADCTENB is a signal that is output from the latency counter 44 when a latency has reached a predetermined value, and an address counter is activated in response to this signal. Each of the signals ROM1 and ROM2 (delay information) is stored in a predetermined region of the memory cell array 11 in the NAND flash memory 1, a time period for which each bit line BL of the SRAM cell arrays 21a to 21c is precharged and equalized is set.

The equalizing timer control circuit 42 selects either the signal ROM1 or the signal ROM2 in accordance with the signal FT_EQLSW, the signal CMD_RAMWRITE or the signal ADCTENB and outputs the selected signal as a signal EQL_TRIM<n:0>.

The equalizing timer 43 determines a time period for performing precharge and equalization in accordance with the signal RAMTDn and the signal EQL_TRIM<n:0>, and outputs an equalizing signal EQL to the SRAM core 45. The SRAM core 45 precharges and equalizes each bit line in accordance with the signal EQL.

[1-4-1] Configuration of SRAM Core 45

A configuration of the SRAM core 45 depicted in FIG. 2, i.e., the SRAM cell arrays 21a, 21b and 21c and the row decoders 22a, 22b and 22c depicted in FIG. 1 will now be described.

Figure 3:
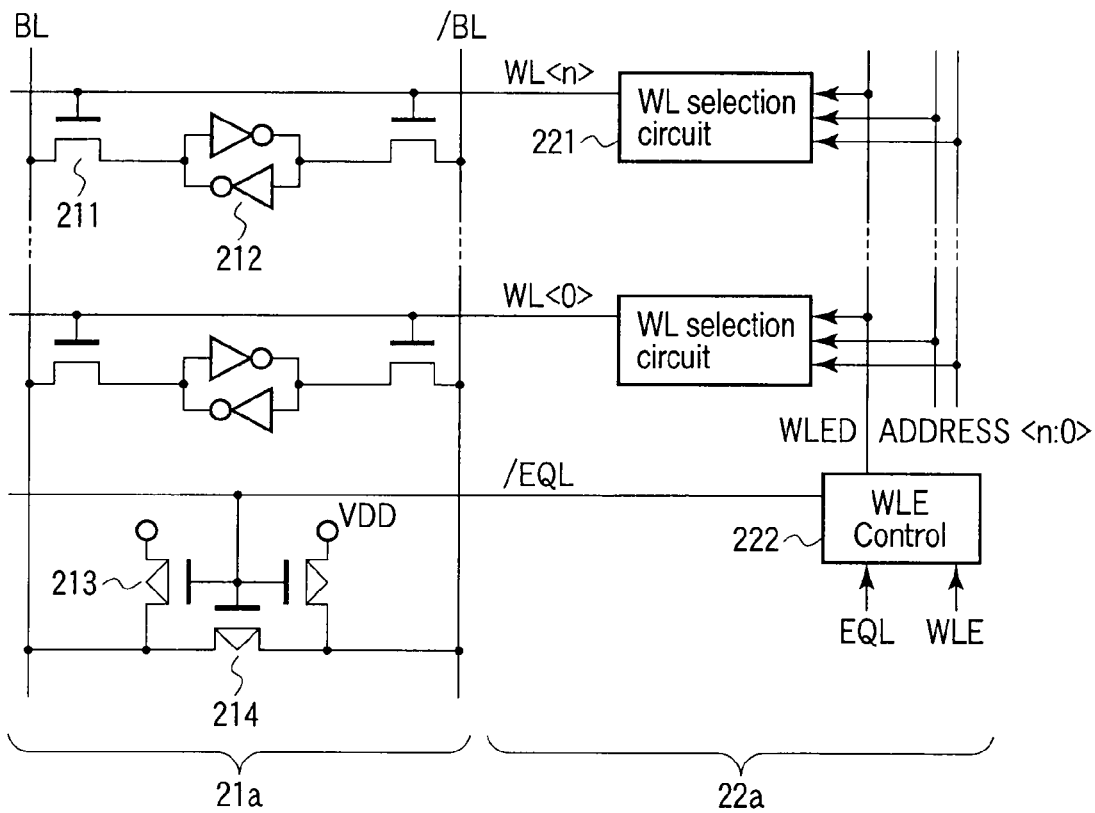
FIG. 3 is a circuit diagram showing configurations of an SRAM cell array, an equalizing transistor and a row decoder in the semiconductor memory device according to the embodiment.

FIG. 3 is a circuit diagram showing configurations of the SRAM cell array and the row decoder in the SRAM 2. It is to be noted that, since the SRAM cell arrays 21a, 21b and 21c have the same configuration and the row decoders 22a, 22b and 22c have the same configuration, configurations of the SRAM cell array 21a and the row decoder 22a will be explained and other descriptions will be omitted.

As shown in FIG. 3, the SRAM cell array 21a includes a plurality of SRAM cells 212 arranged in a matrix form at crossing positions of word lines WL<0> to WL<n> and a pair of bit lines BL and /BL.

Each SRAM 212 has two C-MOS inverters that are connected in parallel in opposite directions. Each SRAM cell 212 is connected with the pair of bit lines BL and /BL through transfer transistors (N-MOS transistors) 211 having gates connected with the word lines WL<0> to WL<n>, respectively.

Further, in the SRAM cell array 21a, a bit line precharge transistor 213 and an equalization transistor (a PMOS transistor) 214 are provided at crossing positions of an equalizing line /EQL and the pair of bit lines BL and /BL.

The bit line precharge transistor 213 is formed of a P-MOS transistor and precharges a potential of the pair of bit lines BL and /BL by using a VDD power supply. The equalization transistor 214 is formed of a P-MOS transistor and equalizes potentials of the pair of bit lines BL and /BL.

The row decoder 22a has a WL selection circuit 221 and a WLE control circuit 222. The WL selection circuit 221 is arranged in accordance with each of the word lines WL<0> to WL<n> and selects each of the word lines WL<0> to WL<n> based on an address <n:0>. The WLE control circuit 222 controls the WL selection circuit 221 and the equalizing line /EQL.

When precharging and equalizing the bit lines BL and /BL under control of the access controller 27, the WL selection circuit 221 and the WLE control circuit 222 precharge potentials in the bit lines BL and /BL by using the VDD power supply and, at the same time, temporarily control potentials in the corresponding word lines WL<0> to WL<n> to "0" level.

[1-4-2] Detailed Configuration of Equalizing Timer Control Circuit 42

The equalizing timer control circuit 42 includes circuits depicted in FIG. 4 and FIG. 5.

The circuit depicted in FIG. 4 includes C-MOS inverters 421, 422, 423 and 424 and NAND elements 425 and 426. The address counter enable signal ADCTENB is input to a first input terminal of the NAND element 425, and the signal CMD_RAMWRITE is input to a second input terminal of the same through the C-MOS inverter 421.

An output from the NAND element 425 is input to a first input terminal of the NAND element 426 through the C-MOS inverters 422 and 423, and the signal FT_EQLSW is input to a second input terminal of the same. Furthermore, an output from the NAND element 426 is output as a signal CNTENB, and an output from the NAND element 426 is output as a signal CNTENBn through the C-MOS inverter 424.

The circuits depicted in FIG. 5 include clocked C-MOS inverters 427 and 428 and a C-MOS inverter 429. The signals ROM1 and ROM2 are input to input terminals of the clocked C-MOS inverters 427 and 428, respectively.

The signal CNTENB is input to a first control terminal of each of the clocked C-MOS inverters 427 and 428, and the signal CNTENBn is input to a second control terminal of the clocked C-MOS inverters 427 and 428. Moreover, an output from the clocked C-MOS inverters 427 and 428 is output as a signal EQL_TRIM through the C-MOS inverter 429.

In the circuits depicted in FIG. 5, the signal ROM1 or the signal ROM2 is selected in accordance with the signal CNTENB or the signal CNTENBn, and the selected signal is output as the signal EQL_TRIM. For example, when the signal CNTENB is "H", the signal ROM2 is output as the signal EQL_TRIM. On the other hand, when the signal CNTENB is "L", the signal ROM1 is output as the signal EQL_TRIM.

[1-4-3] Detailed Configuration of Equalizing Timer 43

A detailed configuration of the equalizing timer 43 that determines a time period for which the bit line BL or /BL is precharged and equalized will now be described.

FIG. 6 is a circuit diagram showing a configuration of the equalizing timer 43 depicted in FIG. 2.

This equalizing timer 43 includes a delay circuit 431, an NAND element 432 and C-MOS inverters 433 and 434. An signal ACT is input to a first input terminal of the NAND element 432, and the signal RAMTDn is input to a second input terminal of the same. The signal RAMTDn is input to a first input terminal of the delay circuit 431, and the signal EQL_TRIM<n:0> is input to a second input terminal of the same. A signal OUT delayed in accordance with the signal EQL_TRIM<n:0> is input to a third input terminal of the NAND element 432. Additionally, an output from the NAND element 432 is output as the equalizing signal EQL through the C-MOS inverters 433 and 434.

FIG. 7 is a circuit diagram showing a configuration of the delay circuit 431 in the equalizing timer 43.

This delay circuit 431 includes C-MOS inverters 4311, 4312 and 4313, an N-MOS transistor 4314, P-MOS transistors 4315 and 4316<n:0> and a resistance element 4317<n–1:0>.

The signal RAMTDn is input to gates of the N-MOS transistor 4314 and the P-MOS transistor 4315 via the C-MOS inverter 4311. The VDD power supply is connected to a source of the P-MOS transistor 4315, and a source of the N-MOS transistor 4314 is connected to a reference potential source (e.g., a ground power supply).

The P-MOS transistors 4316<n:0> are connected in parallel between a drain of the P-MOS transistor 4315 and a drain of the N-MOS transistor 4314. The resistance element 4317<n–1:0> is connected between drains of the P-MOS transistors 4316<n:0> adjacent to each other. Further, an output from a node at which a drain of the P-MOS transistor 4316<0> is connected with the resistance element 4317<0> is output as the signal OUT via the C-MOS inverters 4312 and 4313.

In the delay circuit 431, any one of the P-MOS transistors 4316<n:0> is turned on based on the signal EQL_TRIM<n:0>. In accordance with a position of the P-MOS transistors which is turned on in the P-MOS transistors 4316<n:0>, a resistance value of the resistance element 4317<n–1:0> varies, and output of the signal OUT is delayed.

[2] Operation of Semiconductor Memory Device according to Embodiment

[2-1] Basic Operation of Semiconductor Memory Device

A regular read operation of reading data written in the memory cell array 11 will now be described.

In the regular read operation, first, a user sets a NAND address and an SRAM address of data to be loaded from the external host device through the user interface 29.

Furthermore, the user sets a load command to the register 33 from the external host device via the user interface 29. When the command is written into the register 33, the CUI 34 recognizes that the written command is a function execution command and generates an internal command signal. In this case, the load command is achieved.

Upon accepting achievement of this load command, the state machine 32 is activated. The state machine 32 initializes necessary circuits and then requests the address/command generation circuit 31 to issue a sense command for the NAND unit 1.

Then, to sense data having the NAND address set in the register 33, the address/command generation circuit 31 issues the sense command with respect to the sequencer 16.

Upon receiving this sense command, the sequencer 16 is activated. The sequencer 16 initializes necessary circuits and then controls the voltage supply circuit 15, the row decoder 14, the sense amplifier 12 and the page buffer 13 to execute a sense operation of a specified NAND address. Additionally, the sense data (cell data) loaded from the memory cell array 11 is stored in the page buffer 13.

Further, in response to storage of the sense data in the page buffer 13, the sequencer 16 notifies the state machine 33 of completion of the sense operation with respect to the memory cell array 11.

Upon receiving this notification, the state machine 32 requests the address/command generation circuit 31 to issue a read command (a clock).

The read command from the address/command generation circuit 31 is supplied to the sequencer 16, and the sequencer 16 that has received this read command sets the page buffer 13 to enable reading.

As described above, data in the page buffer 13 is read into the NAND data bus by issuing the read command from the address/command generation circuit 31 to the sequencer 16 in response to the request from the state machine 32, and the read data is transferred to the ECC buffer 24.

Thereafter, an ECC correction start control signal is issued from the state machine 32 via the address/timing generation circuit 35, whereby the ECC engine 25 corrects an error in the data from the ECC buffer 24 and outputs the data subjected to the error correction to the ECC buffer 24.

Further, the error-corrected data in the ECC buffer 24 is read into the ECC data bus and transferred to the DQ buffer 26.

The DQ buffer 26 supplies the stored data to, e.g., the corresponding SRAM cell array 21b from the SRAM data bus to the sense amplifier 23b. In the SRAM cell array 21b, the data is written in accordance with the SRAM address.

The user inputs a control signal that is utilized to read out data from the external host device through the user interface 29, whereby the access controller 27 reads this data into the DQ buffer 26 from the RAM cell array 21b. Furthermore, the data read to the DQ buffer 26 is output to the external host device via, e.g., the RAM/Register data bus, the burst buffer 28a and the user interface 29. Then, the regular read operation is terminated.

[2-2] Read Operation/Write Operation in SRAM 2 in Semiconductor Memory Device

A read operation and a write operation with respect to the SRAM cell arrays (the BootRAM and the DataRAM0 and 1) in the semiconductor memory device according to this embodiment will now be described. In the read operation and the write operation with respect to the SRAM cell array, the precharge operation of precharging and equalizing the pair of bit lines BL and /BL connected with memory cells in the SRAM cell array is performed. The precharge operation of precharging and equalizing the bit lines will now be explained.

The BootRAM and the DataRAM0 and 1 have different bank structures. For example, the BootRAM has 1 bank, and each of the DataRAM0 and 1 has 2 banks.

A description will now be given on each of a read operation or a write operation (an external asynchronous operation) that is performed asynchronously with respect to a clock input from the external host device (an external clock), a read operation or a write operation (an external synchronous operation) that is performed synchronously with respect to the external clock, and a read operation or a write operation (an internal operation) that is performed synchronously with respect to a clock generated inside (an internal clock). Each of the external asynchronous operation and the external synchronous operation is an operation that data is supplied or received between the BootRAM or the DataRAM0 or 1 and the user interface 29. The internal operation is an operation that data is supplied or received between the BootRAM or the DataRAM0 or 1 and the memory cell array 11.

[2-2-1] External Asynchronous Operation

FIG. 8 is a timing chart of the precharge operation at the time of the external asynchronous operation with respect to the DataRAM.

Each signal will be first described. The chip enable signal /CE, the address valid signal /AVD and the address ADD are signals that are input from the external host device. The chip enable signal /CE is a signal that sets the semiconductor memory device to an operable state. The address valid signal /AVD sets a period during which the address ADD can be fetched. The address ADD is an address that is input from the external host device.

The active signal ACT, the address transition detection signal RAMTDn, the equalizing signal EQL and the signal EQL_TRIM are signals that are supplied in the semiconductor memory device. The active signal ACT is a signal indicating that the DataRAM has been selected, and one of the BootRAM and the DataRAM0 and 1 is selected based on the address ADD. Here, one of the DataRAM0 and 1 is selected. The address transition detection signal RAMTDn is a signal that is output when transition of the address ADD, i.e., changeover of the address ADD has been detected as described above, and a predetermined "L" pulse is output in this example.

The equalizing signal EQL is a signal that is utilized to execute precharge and equalization (the precharge operation) of the pair of bit lines BL and /BL connected to the memory cells in the SRAM cell array (the BootRAM or the DataRAM0 or 1). The signal EQL_TRIM is a signal that determines an operation period for the precharge and the equalization set by using the signal ROM1 or the signal ROM2.

The external asynchronous operation will now be described hereinafter with reference to FIG. 8 and FIG. 9.

First, the chip enable signal /CE changes to "L", whereby this semiconductor memory device enters the operable state. Furthermore, the address valid signal/AVD changes to "L" so that a period during which the address ADD is fetched is set.

Then, the active signal ACT changes to "H", and the DataRAM is thereby selected. Moreover, upon detecting changeover of the address ADD, the address transition detection signal RAMTDn changes to "L" for a fixed period. That is, a predetermined "L" pulse is output as the address transition detection signal RAMTDn.

Here, the equalizing signal EQL is "H", and the precharge and the equalization for the bit line BL have been executed. Additionally, in the "L" pulse of the address transition detection signal RAMTDn, when the signal RAMTDn rises to "H" from "L", the equalizing signal EQL falls to "L" from "H" after a period T1 from the rising edge. At this time, the period T1 is determined based on the signal EQL_TRIM that is set by the signal ROM1.

As a result, the precharge and the equalization (the precharge operation) for the pair of bit lines BL and /BL is terminated, and reading or writing (a sense amplifying operation) using the sense amplifier starts.

FIG. 9 is a timing chart showing the precharge operation at the time of the external asynchronous operation for the BootRAM.

As shown in the drawing, since the precharge operation in the BootRAM is the same as the operation depicted in FIG. 8, a description thereof will be omitted. In the external asynchronous operation, the same operation is executed in the DataRAM0 and 1 and the BootRAM having the different bank structures.

[2-2-2] External Synchronous Operation

The external synchronous operation will now be described hereinafter with reference to FIG. 10 and FIG. 11.

FIG. 10 is a timing chart showing the precharge operation at the time of the external synchronous operation with respect to the DataRAM.

Here, burst read synchronized with an external clock will be explained. In this burst read, an address counter enable signal ADCTENB that starts count in the address counter is added. After the address ADD is input, the signal ADCTENB changes to "H" upon receiving an output from the latency counter, i.e., after elapse of a predetermined number of clocks set by a latency. Based on this signal ADCTENB, the address counter starts activation.

First, the chip enable signal /CE changes to "L", whereby this semiconductor memory device enters the operable state. Further, the address valid signal /AVD changes to "L", and a period during which the address ADD is fetched is thereby set.

Then, the active signal ACT changes to "H", and the DataRAM is selected. Furthermore, changeover of the address ADD is detected, and the address transition detection signal RAMTDn changes to "L" for a fixed period. That is, a predetermined "L" pulse is output as the address transition detection signal RAMTDn.

Here, the equalizing signal EQL is "H", and the precharge and the equalization for the bit line BL have been executed. Moreover, in the "L" pulse of the address transition detection signal RAMTDn, when the signal RAMTDn rises to "H" from "L", the equalization signal EQL falls to "L" from "H" after the period T1 from the rising edge. At this time, the period T1 is determined based on the signal EQL_TRIM set by the signal ROM1.

As a result, the precharge and the equalization (the precharge operation) of the pair of bit lines BL and /BL are terminated, and reading using the sense amplifier (the sense amplifying operation) starts. The above-described operation performed until the sense amplifying operation is terminated after the input of the address ADD is determined as a first operation.

During a period of the first operation, i.e., a period until the sense amplifying operation is terminated after the input of the address ADD and the execution of the precharge and the equalization for the bit line, the address counter enable signal ADCTENB is "L", and the address counter does not count addresses.

After this first operation, such a second operation as described below is executed.

After the first operation, when a predetermined period set by the latency elapses, the address counter enable signal ADCTENB changes to "H", whereby the address counter starts counting addresses. As a result, the address counter increments addresses in synchronization with a clock CLK and sequentially outputs incremented addresses.

Moreover, in the addresses sequentially output from the address counter, when a row address included in the addresses is changed over, i.e., the selection of a word line is changed over, this changeover is detected, and the address transition detection signal RAMTDn becomes "L" for a fixed period. That is, a predetermined "L" pulse is output as the address transition detection signal RAMTDn.

Here, in the "L" pulse of the address transition detection signal RAMTDn, when falling from "H" to "L" occurs, the equalizing signal EQL changes to "H" in accordance with the falling edge, and the precharge and the equalization for the bit line BL are executed. Additionally, in the "L" pulse of the address transition detection signal RAMTDn, when the signal RAMTDn rises from "L" to "H", the equalizing signal EQL falls from "H" to "L" after the period T1 from the rising edge. At this time, the period T1 is determined based on the signal EQL_TRIM set by the signal ROM1 as described above.

As a result, the precharge and the equalization (the precharge operation) for the pair of bit lines BL and /BL are terminated, and reading using the sense amplifier (the sense amplifying operation) starts.

FIG. 11 is a timing chart showing the precharge operation at the time of the external synchronous operation for the BootRAM.

As shown in the drawing, the first operation is the same as the operation depicted in FIG. 10, thereby omitting a description thereof.

The second operation performed after the first operation is as follows.

After the first operation, when a predetermined period set by the latency elapses, the address counter enable signal ADCTENB changes to "H", and the address counter thereby starts counting addresses. A change in this signal ADCTENB to "H" is detected, i.e., activation of the address counter is detected, and the signal EQL_TRIM is changed over from the signal ROM1 to the signal ROM2.

Here, a timing for changing over the signal EQL_TRIM from the signal ROM1 to the signal ROM2 can be provided in a period from the end of the precharge operation or the sense amplifying operation in the first operation to the start of the precharge operation in the subsequent second operation. Therefore, although the address counter enable signal ADCTENB is utilized in this example, the present invention is not restricted to this signal ADCTENB, and any other signal that is generated during a period from the end of the precharge operation in the first operation to the start of the precharge operation in the subsequent second operation may be utilized to change over the signal EQL_TRIM from the signal ROM1 to the signal ROM2.

As described above, when the address counter enable signal ADCTENB becomes "H" and counting addresses by the address counter starts, the address counter increments addresses in synchronization with the clock CLK and sequentially outputs the incremented addresses.

Further, in the addresses that are sequentially output from the address counter, when a row address included in the addresses is changed over, namely, when the selection of a word line is changed over, this changeover is detected, and a predetermined "L" pulse is output as the address transition detection signal RAMTDn.

Here, in the "L" pulse of the address transition detection signal RAMTDn, falling from "H" to "L" occurs, the equalizing signal EQL becomes "H" in accordance with the falling edge, and the precharge and the equalization of the bit line BL are executed. Furthermore, in the "L" pulse of the address transition detection signal RAMTDn, when the signal RAMTDn rises from "L" to "H", the equalizing signal EQL falls from "H" to "L" after a period T2 from the falling edge. At this time, since the signal EQL_TRIM has been changed over from the signal ROM1 to the signal ROM2, the period T2 is a time period set by the signal ROM2.

As a result, the precharge and the equalization (the precharge operation) of the pair of bit lines BL and /BL are terminated, and reading using the sense amplifier (the sense amplifying operation) starts.

As described above, in the burst read that is operated in synchronization with the external clock, an execution time of the precharge and the equalization for the bit line that are effected immediately after the input of the address is set to a first time, and the execution of the precharge and the equalization for the bit line that is subsequently carried out is set to a second time shorter than the first time.

As a result, since the execution time of the precharge and the equalization for the bit line in the SRAM cell can be optimized, an increase in speed of the external synchronous operation, e.g., an increase in speed of the burst read that is operated in synchronization with the external clock can be realized.

[2-2-3] Internal Operation

An internal operation will now be described with reference to FIG. 12 and FIG. 13.

FIG. 12 is a timing chart showing the precharge operation at the time of an internal operation for the DataRAM.

Here, load and program synchronized with an internal clock ACLK generated in the semiconductor memory device will be described. The load is an operation of reading data into the SRAM 2 from the NAND flash memory 1. The program is an operation of writing data into the NAND flash memory 1 from the SRAM 2.

As described above, the signal CMD_RAMWRITE is a signal output from the register 33 in the controller unit 3, and it specifies an internal operation as a current operation performed between the NAND flash memory 1 and the SRAM 2. When the signal CMD_RAMWRITE changes to "H", the internal operation is specified as a current operation, changeover between the signal ROM1 and the signal ROM2 is not effected, and the signal EQL_TRIM is fixed to the signal ROM1.

First, the signal CMD_RAMWRITE changes to "H", and the internal operation is specified as the current operation. Moreover, the active signal ACT changes to "H", and the DataRAM is selected.

Subsequently, the address transition detection signal RAMTDn becomes "L" for a fixed period in accordance with a rising edge of the signal CMD_RAMWRITE. That is, a predetermined "L" pulse is output as the address transition detection signal RAMTDn.

Here, the equalizing signal EQL is "H", and the precharge and the equalization for the bit line BL have been executed. Additionally, in the "L" pulse of the address transition detection signal RAMTDn, when the signal RAMTDn rises from "L" to "H", the equalizing signal EQL falls from "H" to "L" after the period T1 from the rising edge. At this time, the period T1 is determined based on the signal EQL_TRIM set by the signal ROM1.

As a result, the precharge and the equalization (the precharge operation) of the pair of bit lines BL and /BL are terminated, and reading or writing using the sense amplifier (the sense amplifying operation) starts.

Thereafter, in addresses sequentially output from the address counter, when a row address included in the addresses is changed over, i.e., when the selection of a word line is changed over, this changeover is detected, and the address transition detection signal RAMTDn becomes "L" for a fixed period. That is, a predetermined "L" pulse is output as the address transition detection signal RAMTDn.

Here, in the "L" pulse of the address detection signal RAMTDn, when falling from "H" to "L" occurs, the equalizing signal EQL becomes "H" in accordance with the falling edge, and the precharge and the equalization for the bit line BL are executed. Further, in the "L" pulse of the address transition detection signal RAMTDn, when the signal RAMTDn rises from "L" to "H", the equalizing signal EQL falls from "H" to "L" after the period T1 from the rising edge. At this time, the period T1 is determined based on the signal EQL_TRIM set by the signal ROM1 as described above.

As a result, the precharge and the equalization (the precharge operation) of the pair of bit lines BL and /BL are terminated, and reading or writing using the sense amplifier (the sense amplifying operation) starts.

FIG. 13 is a flowchart showing the precharge operation at the time of the internal operation for the BootRAM.

As shown in the drawing, the precharge operation in the BootRAM is the same as the operation depicted in FIG. 12, thereby omitting a description thereof. In the internal operation, the same operation is executed in the DataRAM0 and 1 and the BootRAM having different bank structures.

[2-2-4] Selection of Signals ROM1 and 2 in Each Operation of SRAM 2

FIG. 14 is a view showing which one of the signals ROM1 and 2 is selected in each operation of the SRAM 2 according to the embodiment.

The drawing shows which one of the signal ROM1 and the signal ROM2 is selected at the time of each operation, i.e., a read operation that is asynchronous with an external clock (Async Read), a write operation that is asynchronous with an external clock (Async Write), a read operation that is synchronous with an external clock (Sync Read), a write operation that is synchronous with an external clock (Sync Write), load that is synchronous with an internal clock (Load) and program that is synchronous with an internal clock (Program) in the SRAM cell arrays (the BootRAM and the DataRAM0 and 1) 21a to 21c.

It is to be noted that writing is not usually performed with respect to the BootRAM from the external host device, and hence selection at the time of the read operation is represented as (ROM1) or (ROM2). However, the present invention can be likewise applied when the BootRAM is a DataRAM which has banks smaller than those of the DataRAM0 and 1 in number and into which data is written from the external host device. In this case, as shown in FIG. 14, the signal ROM1 is selected at the time of the asynchronous write operation, and the signal ROM2 is selected at the time of the synchronous write operation.

[3] Effects of Embodiment

As described above, according to this embodiment, in the read operation and the write operation that are performed in synchronization with a clock, the execution time for precharge and equalization (the precharge operation) for the bit line that are effected immediately after the input of an address is set to the first time, and the execution time for subsequent precharge and equalization for the bit line is set to the second time shorter than the second time.

As a result, since the execution time for the precharge and the equalization for the bit line in the SRAM cell can be optimized, an increase in speed of the synchronous operation, e.g., an increase in speed of burst read that is performed in synchronization with an external clock can be realized.

Furthermore, since a control circuit that controls an operation time for the precharge and the equalization does not have to be held in accordance with each operation, e.g., the external asynchronous operation, the external synchronous operation or the internal operation, an area (a layout) required for formation of the semiconductor memory device can be reduced.

Moreover, the bit line must be precharged and equalized (the precharge operation) when changing over the word line during the synchronous operation that is performed in synchronization with a clock, an address is changed over in synchronization with a clock during the synchronous operation, and hence the address is not skewed. Therefore, a precharge operation time can be reduced.

In the synchronous operation, it is good enough to change over the setting of the precharge operation time after the input of the address and the end of the first precharge operation and before the start of the next precharge operation. For example, when the address counter enable signal ADCTENB is utilized to change over the setting of the precharge operation time, the precharge operation time in the BootRAM having a bank structure different from that of the DataRAM can be optimized, thereby increasing a speed of the operation.

In this embodiment, even if a plurality of memory devices having a plurality of operations are present in 1 chip, when the setting of a timer that controls each memory device is dynamically configured with respect to each memory device in each operation, the timer can be set without affecting each operation. Additionally, since a timer setting circuit does not have to be held for each operation, an area required for the layout can be reduced.

According to this embodiment, the semiconductor memory device that can increase a speed of the synchronous operation can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory including a first bank number;
a second memory including a second bank number larger than the first bank number; and
a control circuit which controls a precharge operation with respect to bit lines provided in the first and second memories,
wherein when performing, with respect to the first memory, a synchronous operation that is effected in synchronization with a clock, the control circuit changes over a second precharge operation to an operation time different from a first precharge operation during a period from the end of the initial first precharge operation to the start of the subsequent second precharge operation after receiving an address.

2. The device according to claim 1, further comprising a latency counter which outputs an activation signal indicative of activation of an address counter that counts the address when a predetermined latency passes,
wherein the control circuit changes over the operation time of the second precharge operation in accordance with the activation signal.

3. The device according to claim 1, further comprising a detection circuit which detects changeover of the address and outputs a detection signal,
wherein the control circuit stops the first and second precharge operations in accordance with the detection signal.

4. The device according to claim 1, further comprising a third memory which stores delay information that is utilized to set operation times of the first and second precharge operations,
   wherein the control circuit sets the operation times of the first and second precharge operations based on the delay information read out from the third memory.

5. The device according to claim 1,
   wherein each of the first and second precharge operations includes an operation of precharging and equalizing the bit line of the first memory when the selection of a word line provided in the first memory is changed over.

6. The device according to claim 1,
   wherein the first memory has 1 bank, and the second memory has 2 banks.

7. The device according to claim 4,
   wherein each of the first and second memories functions as a buffer memory, and the third memory functions as a main memory.

8. The device according to claim 4,
   wherein each of the first and second memories includes an SRAM cell array, and the third memory includes a NAND flash memory.

9. A semiconductor memory device comprising:
   a first memory including a first bank number;
   a second memory including a second bank number larger than the first bank number;
   a detection circuit which detects changeover of an address and outputs a detection signal;
   a latency counter which counts a latency set based on the address and outputs a changeover signal when counting the latency is terminated; and
   a control circuit which controls a precharge operation that is performed with respect to a bit line provided in the first memory in accordance with the detection signal and changes over an operation time of the precharge operation in accordance with the changeover signal.

10. The device according to claim 9,
    wherein when performing, with respect to the first memory, a synchronous operation that is effected in synchronization with a clock, the control circuit changes over a second precharge operation to an operation time different from a first precharge operation during a period from the end of the initial first precharge operation to the start of the subsequent second precharge operation after receiving the address.

11. The device according to claim 10, further comprising a third memory which stores delay information that is utilized to set operation times of the first and second precharge operations,
    wherein the control circuit sets the operation times of the first and second precharge operations based on the delay information read out from the third memory.

12. The device according to claim 10,
    wherein each of the first and second precharge operations includes an operation of precharging and equalizing the bit line of the first memory when the selection of a word line provided in the first memory is changed over.

13. The device according to claim 9,
    wherein the first memory has 1 bank, and the second memory has 2 banks.

14. The device according to claim 11,
    wherein each of the first and second memories functions as a buffer memory, and the third memory functions as a main memory.

15. The device according to claim 11,
    wherein each of the first and second memories includes an SRAM cell array, and the third memory includes a NAND type flash memory.

* * * * *